(12) United States Patent
Isozaki et al.

(10) Patent No.: US 11,923,266 B2
(45) Date of Patent: Mar. 5, 2024

(54) SEMICONDUCTOR MODULE CIRCUIT STRUCTURE

(71) Applicant: FUJI ELECTRIC CO., LTD., Kawasaki (JP)

(72) Inventors: Makoto Isozaki, Kawasaki (JP); Seiichi Takahashi, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 436 days.

(21) Appl. No.: 17/363,378

(22) Filed: Jun. 30, 2021

(65) Prior Publication Data

US 2021/0327781 A1    Oct. 21, 2021

Related U.S. Application Data

(63) Continuation of application No. PCT/JP2020/021619, filed on Jun. 1, 2020.

(30) Foreign Application Priority Data

Jul. 3, 2019  (JP) ................. 2019-124452

(51) Int. Cl.
*H01L 23/367* (2006.01)
*H01L 23/14* (2006.01)
*H01L 23/49* (2006.01)
*H01L 23/498* (2006.01)
*H01L 25/065* (2023.01)
*H01L 27/07* (2006.01)

(52) U.S. Cl.
CPC .......... *H01L 23/367* (2013.01); *H01L 23/147* (2013.01); *H01L 23/49* (2013.01); *H01L 23/49811* (2013.01); *H01L 23/49822* (2013.01); *H01L 23/49838* (2013.01); *H01L 25/0655* (2013.01); *H01L 27/0727* (2013.01)

(58) Field of Classification Search
None
See application file for complete search history.

(56) References Cited

U.S. PATENT DOCUMENTS

2008/0054491 A1 * 3/2008 Makino ............... H01L 25/18
                                                     257/E23.079
2011/0310568 A1   12/2011 Hong et al.
2013/0069215 A1 * 3/2013 Nakao ............... H01L 23/3735
                                                     257/687

FOREIGN PATENT DOCUMENTS

JP    H06-29646 A    2/1994
JP    H06-338668 A   12/1994
JP    2000-277872 A  10/2000
(Continued)

*Primary Examiner* — Cory W Eskridge
(74) *Attorney, Agent, or Firm* — Rabin & Berdo, P.C.

(57) ABSTRACT

A semiconductor module circuit structure, including an insulating circuit substrate having an insulating plate, and a circuit pattern formed on a top face of the insulating plate, and a semiconductor element disposed on a top face of the circuit pattern. The circuit pattern includes a first straight part extending in a first direction, a second straight part extending in a second direction different from the first direction, and a corner part connecting the first and second straight parts. A wiring member is formed on a top surface of the first straight part along the first direction, the wiring member being formed off-center at the first straight part to be closer to an outer periphery of the circuit pattern.

13 Claims, 6 Drawing Sheets

(56) References Cited

FOREIGN PATENT DOCUMENTS

| | | |
|---|---|---|
| JP | 2001-085611 A | 3/2001 |
| JP | 2010-251551 A | 11/2010 |

\* cited by examiner

SEMICONDUCTOR MODULE CIRCUIT STRUCTURE

CROSS REFERENCE TO RELATED APPLICATIONS

This is a continuation application of International Application PCT/JP2020/021619 filed on Jun. 1, 2020 which claims priority from a Japanese Patent Application No. 2019-124452 filed on Jul. 3, 2019, the contents of which are incorporated herein by reference.

BACKGROUND OF THE INVENTION

Technical Field

The present invention relates to a semiconductor module circuit structure.

Background Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters.

Inverter apparatuses used widely for applications such as driving consumer and industrial motors include semiconductor switching elements (switching elements) such as MOSFETs and IGBTs, and a driving integrated circuit (IC chip) that drives the semiconductor switching elements. Also, an intelligent power module (IPM) combining the above switching elements and the IC chip into a single package is used as a means of miniaturizing equipment and incorporating the module into a protective circuit.

Meanwhile, Patent Literature 1 and 2 indicated below propose a technology in which conductive members (bonding wires) are disposed on a conductive pattern to enable a large flow of current in a semiconductor module or an integrated circuit. Also, in Patent Literature 3, wire interconnects are disposed on a circuit pattern conductive layer to reduce the resistance value of the circuit pattern conductive layer on a substrate. Furthermore, in Patent Literature 4, wires are bonded onto conductive paths to prevent meltdown of the conductive paths due to inrush current.

CITATION LIST

Patent Literature

Patent Literature 1: Japanese Patent Laid-Open No. 2010-251551
Patent Literature 2: Japanese Patent Laid-Open No. 6-29646
Patent Literature 3: Japanese Patent Laid-Open No. 2001-85611
Patent Literature 4: Japanese Patent Laid-Open No. 6-338668

SUMMARY OF THE INVENTION

Also, in recent years, a reverse-conducting IGBT (RC-IGBT) combining the functions of an IGBT element and an FWD element has been developed. With an RC-IGBT element, the chip area is reduced compared to the past for the same current rating, which enables denser mounting. In other words, it is possible to raise the current rating compared to the past for the same chip area.

In this way, adopting an RC-IGBT makes it possible to achieve a current rating that could not be achieved with a package size of the past, but conversely, the amount of heat generated in the circuitry increases proportionally with the square of the current as the amount of electricity is increased further (increased current density). As a result, abnormal overheating of the circuit pattern that did not pose a problem with the current rating of the past may occur.

An object of the present invention, which has been made in light of such points, is to provide a semiconductor module circuit structure capable of suppressing abnormal overheating of the circuit pattern while also raising the current rating.

A semiconductor module circuit structure according to one aspect of the present invention is provided with: an insulating circuit substrate in which a circuit pattern is formed on a top face of an insulating plate; and a semiconductor element disposed on a top face of the circuit pattern, wherein the circuit pattern includes a straight part extending in a predetermined direction and a corner part bent in a different direction from the extension direction of the straight part, and on a top face of the straight part, a wiring member that follows the extension direction of the straight part is disposed off-center toward an outer circumferential side of the corner part.

Also, a semiconductor module circuit structure according to another aspect of the present invention is provided with: an insulating circuit substrate in which a circuit pattern is formed on a top face of an insulating plate; and a semiconductor element disposed on a top face of the circuit pattern, wherein the circuit pattern includes a straight part extending in a predetermined direction and a corner part bent in a different direction from the extension direction of the straight part, and on a top face of the corner part, a wiring member that follows the bend direction is disposed off-center toward an outer circumferential side.

According to the present invention, abnormal overheating of the circuit pattern can be suppressed while also raising the current rating.

DESCRIPTION OF THE INVENTION

Figure 1:
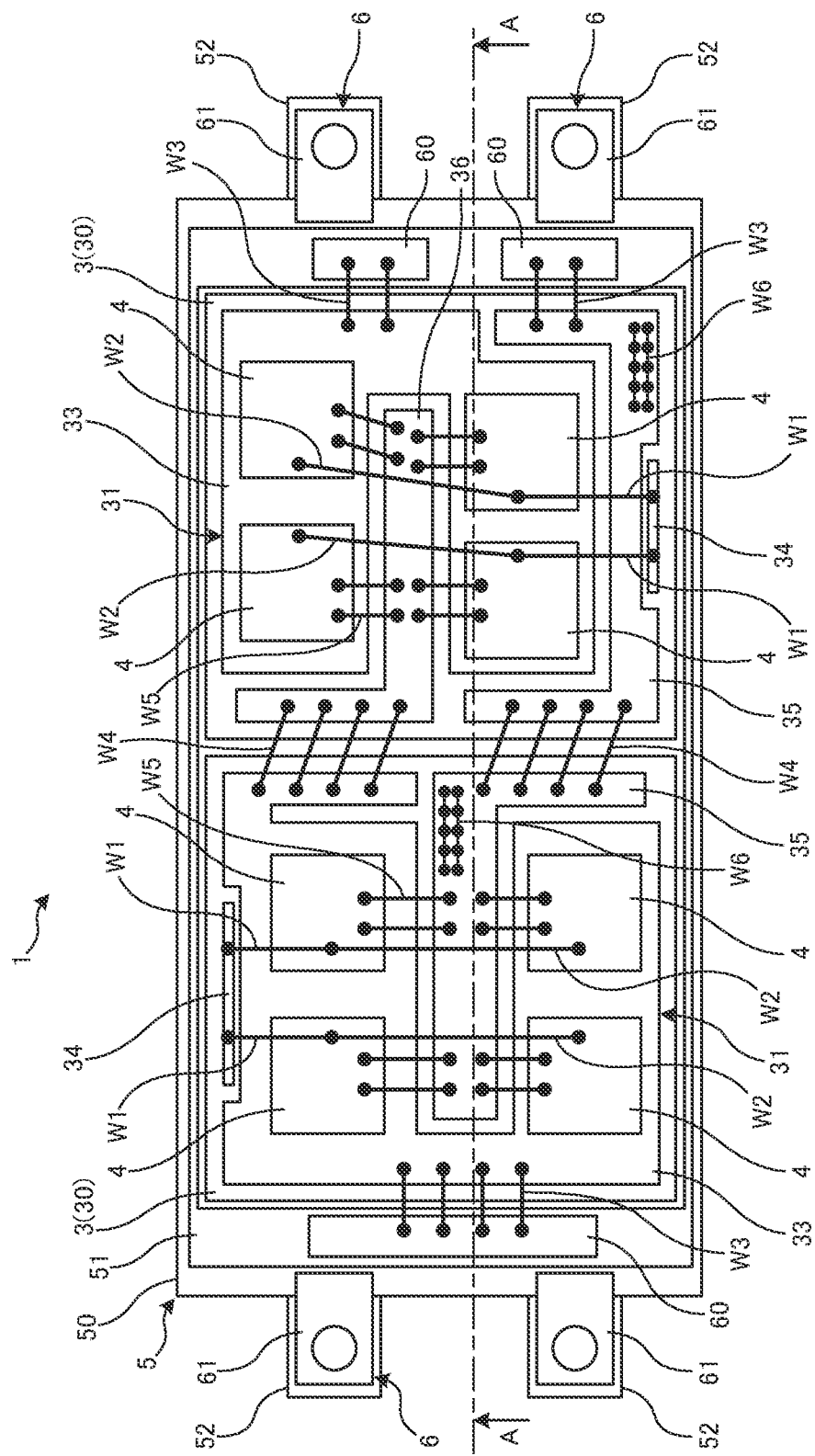
FIG. 1 is a schematic plan view illustrating an example of a semiconductor module according to an embodiment.
Figure 2:
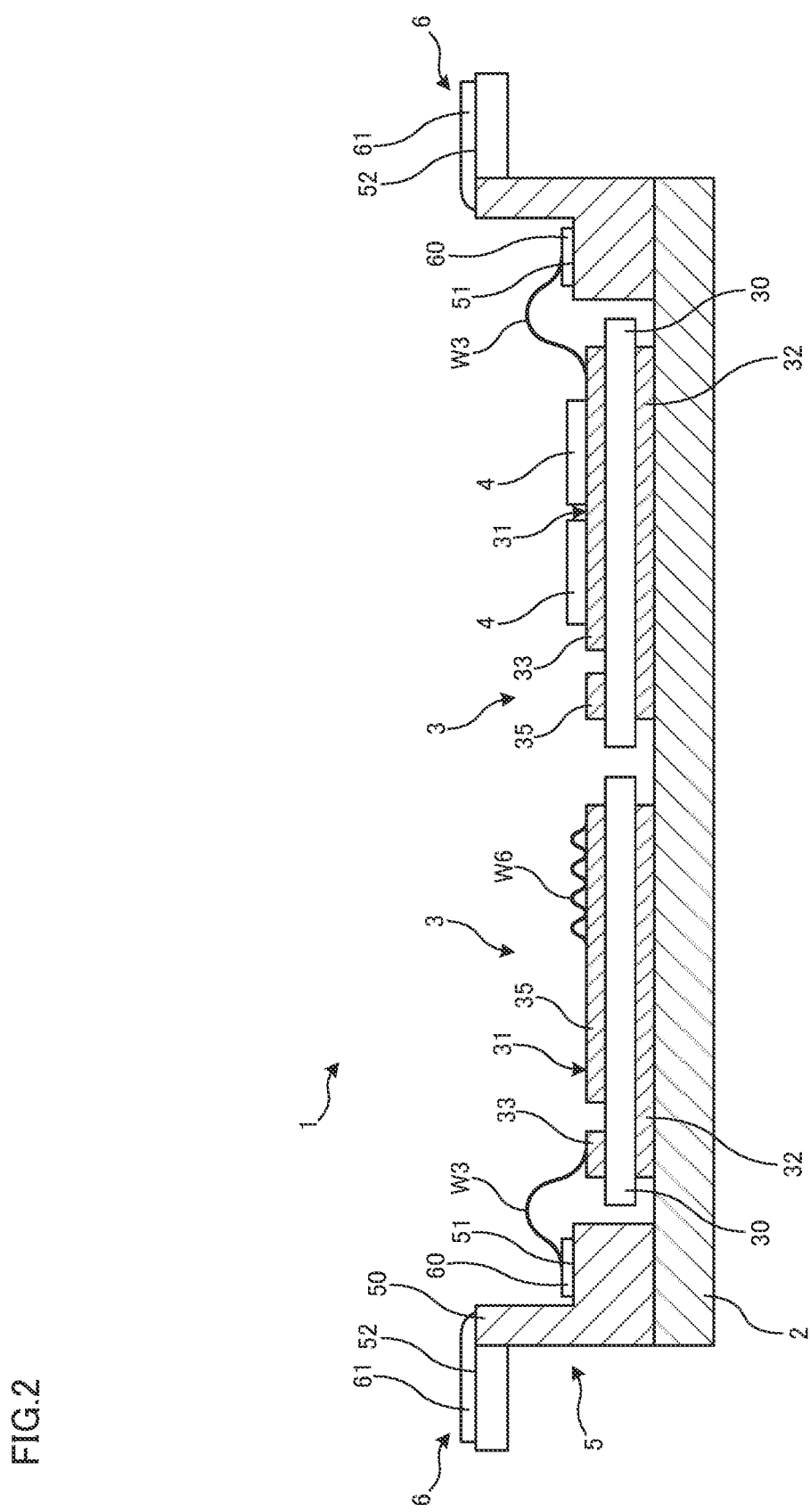
FIG. 2 is a schematic cross-section view illustrating an example of the semiconductor module according to the embodiment.

Hereinafter, a semiconductor module to which the present invention can be applied will be described. FIG. 1 is a schematic plan view illustrating an example of a semiconductor module according to an embodiment. FIG. 2 is a schematic cross-section view illustrating an example of the semiconductor module according to the embodiment. Specifically, FIG. 2 is a cross section taken along the A-A in FIG. 1. Note that the semiconductor module illustrated below is merely one non-limiting example, and may be modified appropriately. In this specification, a plan view means the case of looking at the semiconductor module from a direction perpendicular to an insulating circuit substrate described later.

A semiconductor module 1 is applied to a power conversion device such as a power module, for example. As illustrated in FIGS. 1 and 2, a semiconductor module 1 includes components such as a heatsink 2, insulating circuit substrates 3, and a plurality of semiconductor elements 4.

The heatsink 2 acts as a base plate of the insulating circuit substrate 3, and is formed having a rectangular shape in a plan view by a metal plate with favorable thermal conductivity, such as copper or aluminum.

Insulating circuit substrates 3 are disposed on the top face (main surface) of the heatsink 2. The insulating circuit substrates 3 are formed by stacking metal layers and insulating layers, and are formed having a square shape in a plan view. In the present embodiment, two insulating circuit substrates 3 are arranged side by side in the longitudinal direction of the heatsink 2. The two insulating circuit substrates 3 are disposed on the top face of the heatsink 2 through a bonding material (not illustrated) such as solder, for example.

Each insulating circuit substrate 3 is a direct copper bonding (DCB) substrate or an active metal brazing (AMB) substrate, for example. Specifically, each insulating circuit substrate 3 includes an insulating plate 30 having a top face and a bottom face, a circuit pattern 31 formed on the top face (main surface) of the insulating plate 30, and a metal plate 32 formed on the bottom face of the insulating plate 30. The insulating plate 30 is formed having a square shape in a plan view by an insulating material such as ceramic or resin. For the insulating material, a ceramic material such as alumina ($Al_2O_3$), aluminum nitride (AlN), or silicon nitride ($Si_3N_4$), a resin material such as epoxy, or an epoxy resin material using a ceramic material as a filler is used, for example.

The circuit pattern 31 contains a conductor having a predetermined thickness. The thickness of the circuit pattern 31 may be 50 μm or greater and 2.0 mm or less, preferably 100 μm or greater and 500 μm or less. If the circuit pattern 31 is too thin, the electrical resistance may increase and loss may occur or heat may be produced in some cases. If the circuit pattern 31 is too thick, warping or damage may occur due to stress with the insulating plate 30 in some cases. The material of the circuit pattern 31 is copper, aluminum, or an alloy containing at least one of these as a main component, for example. Furthermore, nickel or a nickel alloy may also be formed on the surface of the circuit pattern 31, for example. The circuit pattern 31 includes a plurality of circuit patterns 33 to 36 in independent islands (that is, electrically isolated from each other) in a plan view. In FIG. 1, three independent circuit patterns 33 to 35 are formed on the insulating plate 30 positioned on the left side of the page, while four independent circuit patterns 33 to 36 are formed on the insulating plate 30 positioned on the right side of the page. Note that the corresponding circuit patterns 31 on each of the left and right insulating plates 30 are denoted with the same sign for convenience. Also, each circuit pattern 31 will be described later.

The metal plate 32 contains a metal layer of predetermined thickness formed by copper foil or the like, similarly to the circuit pattern 31. The metal plate 32 has a flat surface and has a square shape in a plan view that covers substantially all of the bottom face of the insulating plate 30. Specifically, the outer periphery of the metal plate 32 is positioned slightly inward from the outer periphery of the insulating plate 30. The bottom face of the metal plate 32 faces the top face of the heatsink 2. The metal plate 32 is bonded to the top face of the heatsink 2 through a bonding material not illustrated.

Four semiconductor elements 4 are disposed on the top face of the circuit pattern 33. The semiconductor elements 4 are formed having a square shape in a plan view by a semiconductor substrate such as silicon (Si) or silicon carbide (SiC) for example. In the present embodiment, the semiconductor elements 4 are configured as a reverse-conducting insulated-gate bipolar transistor (RC-IGBT) element combining the functions of an IGBT element and a free-wheeling diode (FWD) element.

Note that the semiconductor elements 4 are not limited to the above, and a switching element such as an IGBT or a power metal-oxide-semiconductor field-effect transistor (power MOSFET), or a diode such as a free-wheeling diode (FWD) may also be used singly. Also, an element such as a reverse-blocking IGBT (RB-IGBT) having a sufficient withstand voltage with respect to reverse bias may also be used. Also, properties such as the shape, number, and placement of the semiconductor elements 4 may be changed appropriately.

An input electrode (anode) not illustrated that acts as a main electrode is provided on the top face of each semiconductor element 4. An output electrode (cathode) not illustrated that acts as a main electrode is provided on the bottom face of each semiconductor element 4. The bottom face of each semiconductor element 4 is electrically bonded to the top face of the circuit pattern 33 through a bonding material (not illustrated) such as solder, for example.

Also, a frame-shaped case member 5 is disposed on the top face on the outer circumference of the heatsink 2. The case member 5 is formed by plastic for example, and is bonded to the heatsink 2 through an adhesive (not illustrated). The case member 5 has an annular wall part 50 that surrounds the perimeter of the two insulating circuit substrates 3. The annular wall part 50 is formed having a squared ring shape in a plan view that follows the outer shape of the heatsink 2. Also, the annular wall part 50 stands upright in the thickness direction of the semiconductor module 1 (vertical direction). A step part 51 that is a step down is formed on the inner circumferential side of the top face of the annular wall part 50. The step part 51 is formed by a recess having a squared ring shape, and the top face of the step part 51 is provided at a lower position than the top face of the annular wall part 50.

Also, terminal members 6 are respectively embedded in the pair of walls facing each other in the longitudinal direction of the annular wall part 50. Tabular projecting tabs 52 that project horizontally outward are formed on the upper edges of the annular wall part 50 in correspondence with the terminal members 6.

The terminal members 6 are formed by bending a plate-like body of metal, for example. The terminal members 6 have an inner terminal part 60 exposed on the top face of the step part 51 and an outer terminal part 61 exposed on the top face of the projecting tabs 52. The terminal members 6 positioned on the left side of the page in FIG. 1 are formed integrally such that one inner terminal part 60 and two outer terminal parts 61 are electrically connected inside the annular wall part 50. On the other hand, the terminal members 6 positioned on the right side of the page in FIG. 1 are each formed integrally such that one inner terminal part 60 and one outer terminal part 61 are electrically connected inside the annular wall part 50. In other words, on the right side of the page in FIG. 1, two electrically independent terminal members 6 are arranged side by side in the lateral direction of the annular wall part 50.

Each of the semiconductor elements 4, the circuit pattern 31, and the terminal members 6 are electrically connected by wiring members (wires). Specifically, the semiconductor elements 4 and the circuit pattern 34 are electrically connected by a wiring member W1.

Also, on the left side of the page in FIG. 1, the pairs of semiconductor elements 4 facing each other across the circuit pattern 35 are electrically connected by a wiring member W2. Similarly, on the right side of the page in FIG. 1, the pairs of semiconductor elements 4 facing each other across the circuit pattern 36 are electrically connected by the wiring member W2.

On the left side of the page in FIG. 1, the circuit pattern 33 on which the semiconductor elements 4 are mounted and the inner terminal part 60 are electrically connected by a wiring member W3. Similarly, on the right side of the page in FIG. 1, the circuit pattern 33 on which the semiconductor elements 4 are mounted and one of the inner terminal parts 60 are electrically connected by the wiring member W3. Also, on the right side of the page in FIG. 1, the circuit pattern 35 and the other of the inner terminal parts 60 are electrically connected by the wiring member W3.

The circuit pattern 33 on the left side of the page and the circuit pattern 36 on the right side of the page in FIG. 1 are electrically connected by a wiring member W4. Similarly, the circuit pattern 35 on the left side of the page and the circuit pattern 35 on the right side of the page in FIG. 1 are electrically connected by the wiring member W4.

Also, on the left side of the page in FIG. 1, the circuit pattern 35 and the semiconductor elements 4 are electrically connected by a wiring member W5. Similarly, on the right side of the page in FIG. 1, the circuit pattern 36 and the semiconductor elements 4 are electrically connected by the wiring member W5.

Also, although details will be described later, a plurality of wiring members W6 are disposed on the circuit patterns 35 in the extension direction. The wiring members W6 are disposed in plural (in FIG. 1, two), arranged side by side in the width direction (the direction orthogonal to the extension direction) of the circuit patterns 35 in a plan view. Also, each wiring member W6 is electrically connected to the circuit pattern 35 at multiple points.

Straight conducting wires are used for the wiring members W1 to W6 described above. The wires have a circular cross section with a diameter of 25 µm or greater and 600 µm or less. Gold, copper, aluminum, a gold alloy, a copper alloy, and an aluminum alloy can be used either singly or in combination with each other as the material of the conducting wires. The wiring members W1 to W6 may be bonded to each of the circuit patterns and the semiconductor elements by wedge bonding.

The wiring members W6 disposed along the extension direction on the circuit patterns 35 may be straight wires having a circular cross section with a diameter of 100 µm or greater and 600 µm or less. Additionally, it is also possible to use a member other than wires as the wiring members W6. For example, thin conducting ribbons can be used as the wiring members W6. The width of the ribbons is 500 µm or greater and 2.5 mm or less. The thickness of the ribbons is 50 µm or greater and 250 µm or less. Copper, aluminum, a copper alloy, and an aluminum alloy can be used either singly or in combination with each other as the material of such wiring members W6. Furthermore, to adjust the electrical resistance, silicon, iron, tungsten, and titanium may also be added either singly or in combination with each other. Such wiring members W6 are connected to the circuit patterns 35 at multiple points using wedge bonding or laser bonding.

Although not specifically illustrated, the internal space of the case member 5 prescribed by the annular wall part 50 is encapsulated by an encapsulating resin. Specifically, the interior of the case member 5 is filled with enough encapsulating resin to sufficiently cover the insulating circuit substrates 3, the semiconductor elements 4, the wiring members, and the inner terminal parts 60. Note that an epoxy resin or a silicone gel may be used as the encapsulating resin.

Meanwhile, as described earlier, an RC-IGBT element combining the functions of an IGBT element and an FWD element has been developed recently. With an RC-IGBT element, the chip area is reduced for the same current rating compared to the case of forming a single switch element by pairing an IGBT element with an FWD element, thereby enabling denser mounting.

More specifically, with an RC-IGBT element, the chip area can be reduced by approximately 20% for the same current rating compared to the case of combining separate IGBT and FWD elements. Consequently, there is an advantage of being able to reduce the product size of the semiconductor module while still achieving the same current rating as in the past.

In other words, if an RC-IGBT element having the same area as the chip area in the case of combining separate IGBT and FWD elements, the current rating can be raised further (approximately 25%). In this case, it is possible to raise the current rating while maintaining the same product size of the semiconductor module as in the past.

However, as a result of raising the current rating compared to the past, the amount of heat generated in the circuitry increases proportionally with the square of the current, and consequently, abnormal overheating of the circuit pattern that did not pose a problem with the current rating of the past may occur. This is thought to occur because of positional deviation occurring in the current that flows through the circuit pattern.

Here, the circuit structure of the semiconductor module 1 according to the embodiment will be described with reference to FIG. 3. FIG. 3 is an enlarged view of a portion of the semiconductor module circuit structure according to the embodiment. More specifically, FIG. 3A is an enlarged view of the portion around the circuit pattern 35 in FIG. 1, and FIG. 3B is an enlarged view of the portion around the circuit pattern 35 in FIG. 2.

Figure 3A:
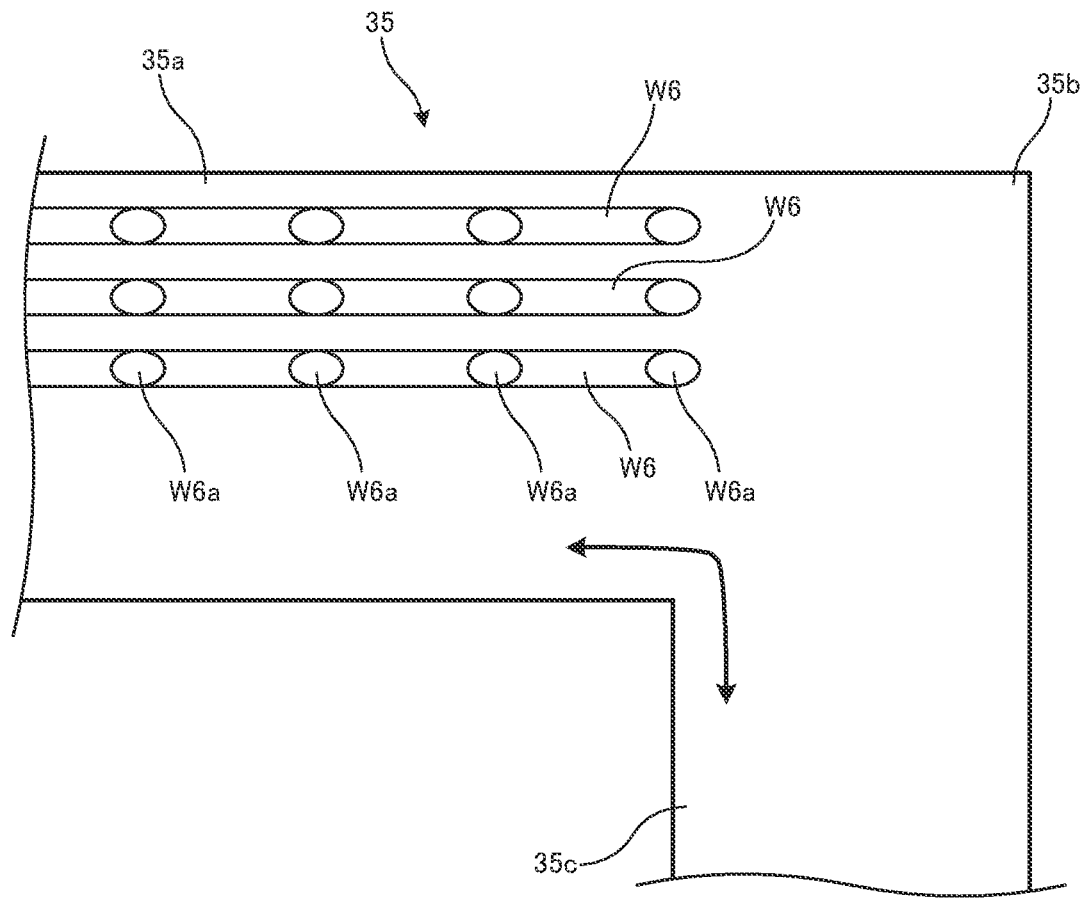
FIGS. 3A and 3B are an enlarged view of a portion of the semiconductor module circuit structure according to the embodiment.
Figure 3B:
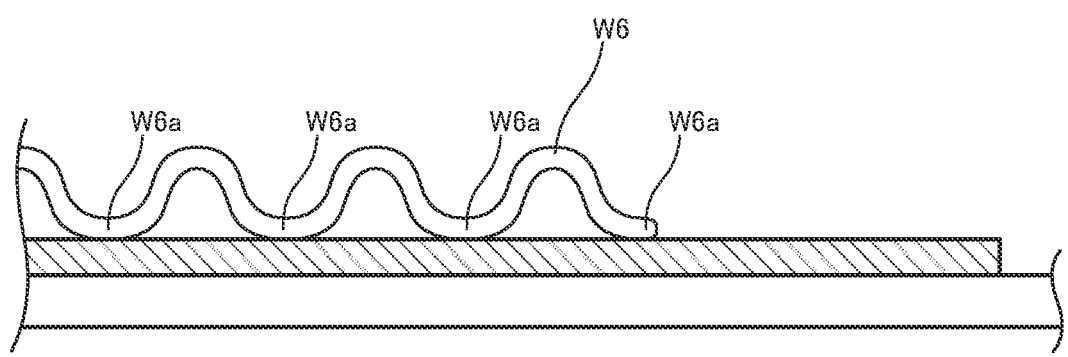

As illustrated in FIG. 3A, the circuit pattern 35 has a first straight part 35a extending in a predetermined direction, a corner part 35b bent in a different direction from the extension direction of the first straight part 35a, and a second straight part 35c extending in the bend direction of the corner part 35b.

The first straight part 35a extends along the longitudinal direction of the semiconductor module 1 (the horizontal direction on the page in FIG. 3), for example. The corner part 35b is bent at a right angle from the end of the first straight part 35a. The second straight part 35c extends in the lateral direction of the semiconductor module 1 (the vertical direction on the page in FIG. 3) from the end of the corner part 35b, for example. In other words, the first straight part 35a and the second straight part 35c are joined to form a right angle at the corner part 35b.

Although a highly conductive metal material such as copper is used, the circuit pattern 31 (35) normally has a predetermined resistance. Particularly, in the case where the circuit pattern 35 has the corner part 35b like in FIG. 3A, current flowing through the circuit pattern 35 tends to flow through areas of lower resistance. In other words, current tries to flow along a path of least resistance in the circuit pattern 35. More specifically, current tries to flow on the inner circumferential side of the circuit pattern 35 (corner part 35b) (refer to arrow in FIG. 3A). In this case, current flows less readily on the outer circumferential side of the circuit pattern 35 compared to the inner circumferential side. In this way, a deviation in the current flowing through the circuit pattern 35 may be considered to occur depending on the path.

Accordingly, the inventor focused on positional deviation occurring in current flowing through a circuit pattern as above, and thereby conceived of the present invention. Specifically, in the present embodiment, a plurality of (for example, three) wiring members W6 are disposed on the top face of the first straight part 35a along the extension direction of the first straight part 35a. In addition, the plurality of wiring members W6 are disposed off-center toward the outer circumferential side of the corner part 35b.

According to this configuration, by disposing the wiring members W6 off-center toward the outer circumferential side of the circuit pattern 35, it is possible to lower the resistance on the outer circumferential side of the circuit pattern 35. As a result, it is possible to make current flow more easily on the outer circumferential side of the circuit pattern 35. More specifically, current flows not only on the inner circumferential side of the circuit pattern 35 but also on the outer circumferential side of the circuit pattern 35 that includes the wiring members W6.

In this way, by diverting the current flowing through the circuit pattern 35, it is possible to reduce positional deviation in the current flowing through the circuit pattern 35. As a result, the current density in the circuit pattern 35 is lowered and current flows more easily throughout the entire circuit pattern 35. Consequently, it is possible to make the heat distribution of the circuit pattern 35 uniform and prevent localized abnormal overheating.

Such an abnormal overheating prevention effect is more pronounced in the semiconductor module 1 provided with an RC-IGBT element combining the functions of an IGBT element and an FWD element. Consequently, according to the present embodiment, it is possible to suppress abnormal overheating of the circuit pattern while also raising the current rating.

Figure 4:
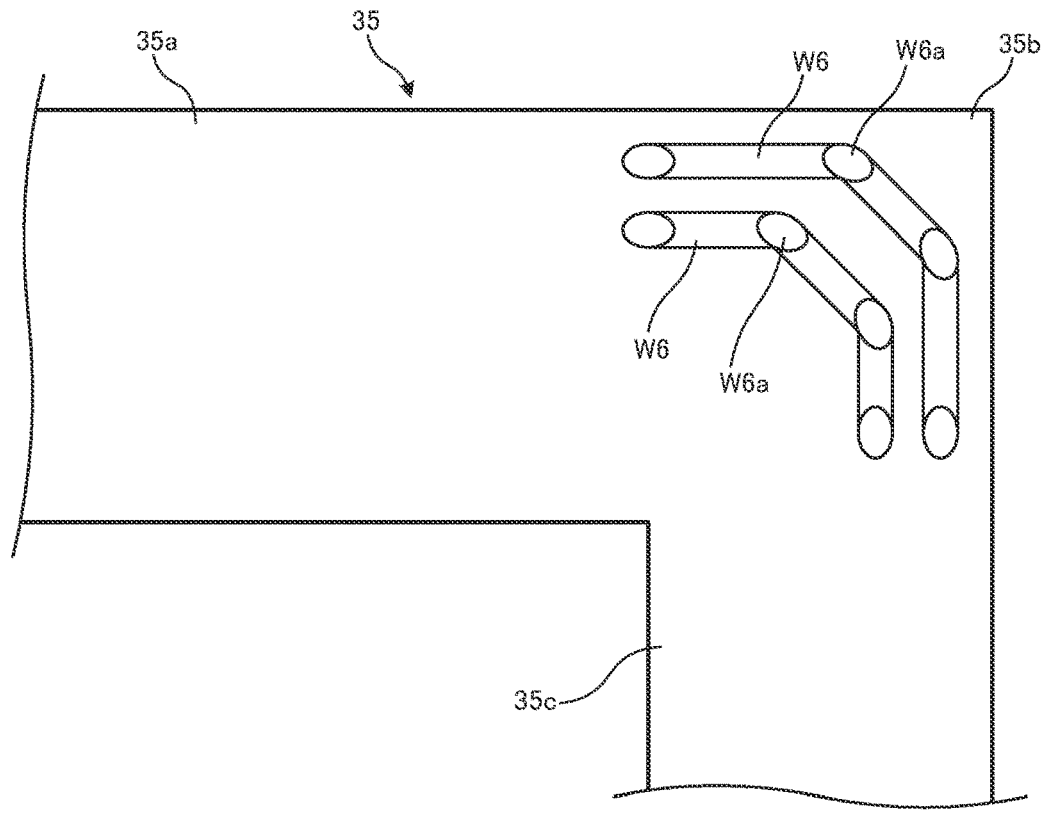
FIG. 4 is a schematic diagram illustrating the semiconductor module circuit structure according to a first modification.
Figure 5:
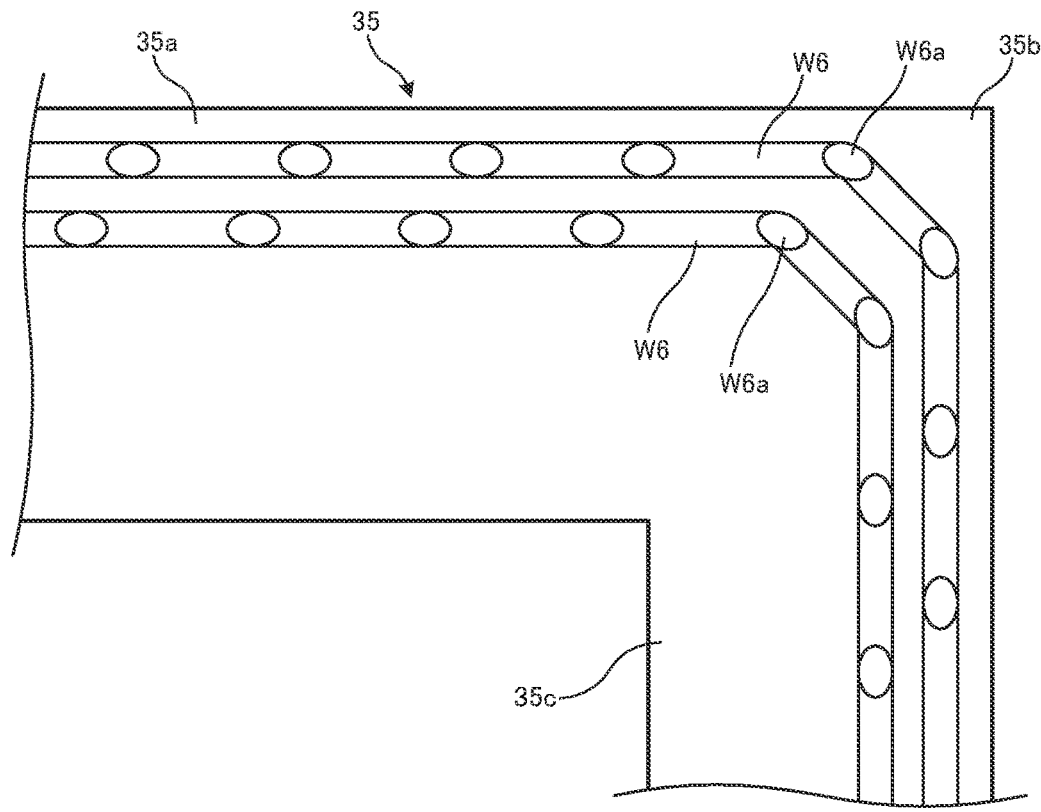
FIG. 5 is a schematic diagram illustrating the semiconductor module circuit structure according to a second modification.
Figure 6:
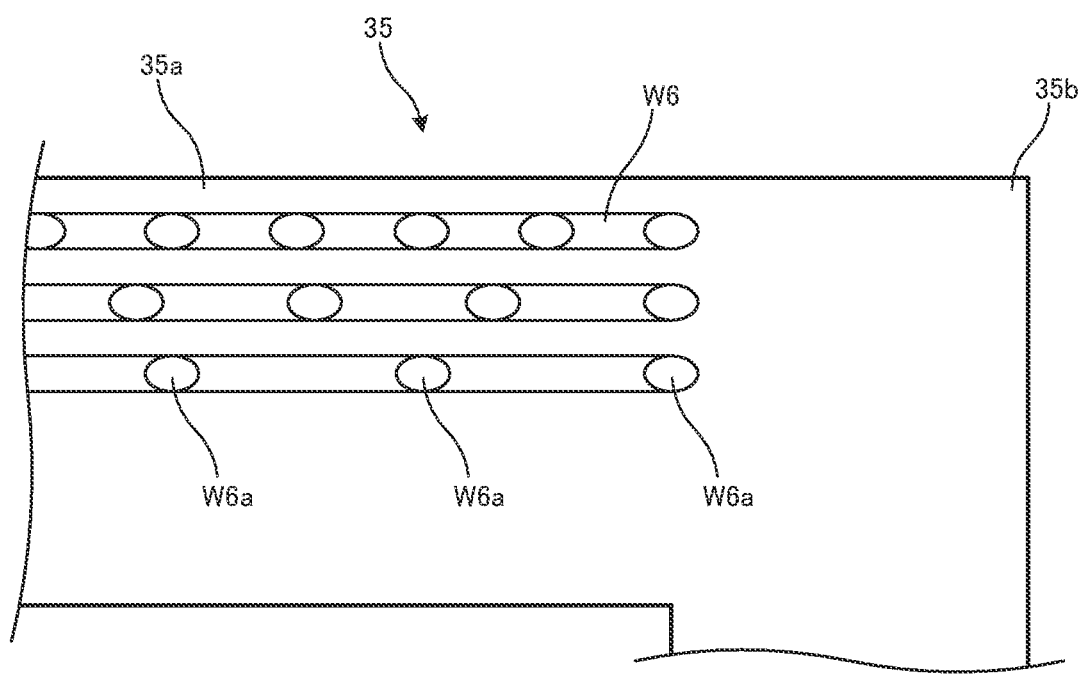
FIG. 6 is a schematic diagram illustrating the semiconductor module circuit structure according to a third modification.
Figure 7:
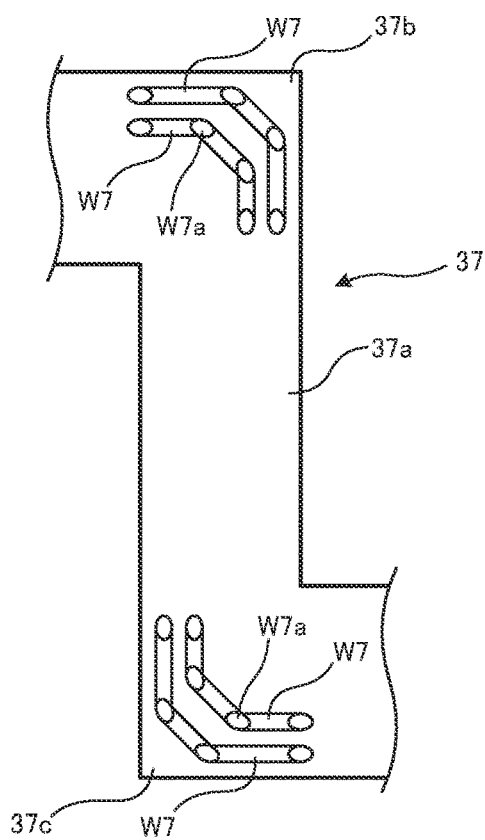
FIG. 7 is a schematic diagram illustrating the semiconductor module circuit structure according to a fourth modification.
Figure 8:
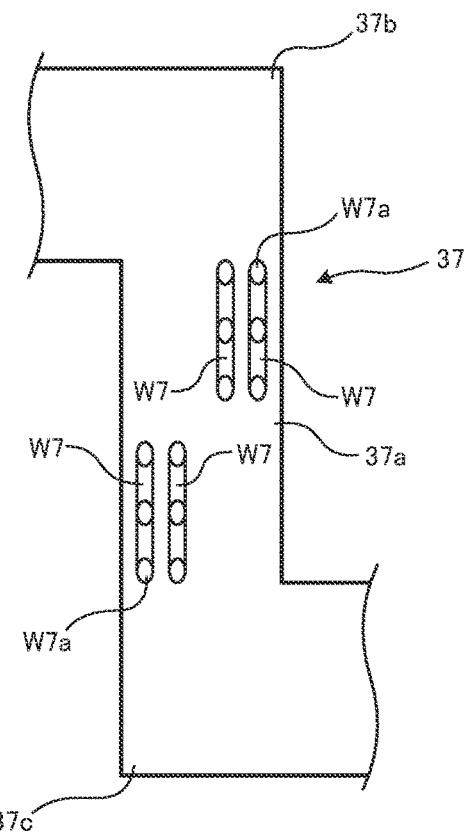
FIG. 8 is a schematic diagram illustrating the semiconductor module circuit structure according to a fifth modification.

Next, semiconductor module circuit structures according to modifications will be described with reference to FIGS. 4 to 8. FIG. 4 is a schematic diagram illustrating the semiconductor module circuit structure according to a first modification. FIG. 5 is a schematic diagram illustrating the semiconductor module circuit structure according to a second modification. FIG. 6 is a schematic diagram illustrating the semiconductor module circuit structure according to a third modification. FIG. 7 is a schematic diagram illustrating the semiconductor module circuit structure according to a fourth modification. FIG. 8 is a schematic diagram illustrating the semiconductor module circuit structure according to a fifth modification.

In the above embodiment, the wiring members W6 are configured to be disposed on the top face of the first straight part 35a, but are not limited to this configuration. For example, the configuration illustrated in FIG. 4 is also possible. As illustrated in FIG. 4, the wiring members W6 may also be disposed on the top face of the corner part 35b. The wiring members W6 are disposed to form an L-shape in a plan view along the bend direction of the corner part 35b. Also, two wiring members W6 are provided side by side in the width direction of the circuit pattern 35. Furthermore, the two wiring members W6 are disposed off-center toward the outer circumferential side of the corner part 35b. With such a wiring configuration, the resistance on the outer circumferential side of the circuit pattern 35 likewise can be lowered similarly to the above, making it possible to prevent localized abnormal overheating.

In addition, the wiring patterns of FIGS. 3 and 4 may also be combined to dispose the wiring members W6 on the outer circumferential side of the circuit pattern 35 like in FIG. 5. With this arrangement, it is possible to make the heat distribution of the circuit pattern 35 uniform and obtain an even greater effect of suppressing abnormal overheating.

Also, as illustrated in FIG. 6, the number of connection points W6a on the wiring members W6 with respect to the circuit pattern 35 may be increased proceeding circumferentially outward in the width direction of the circuit pattern 35. For example, if the spacing of the connection points W6a on the wiring members W6 is taken to be 1 for the wiring member W6 that is farthest inward circumferentially, the spacing for the wiring member W6 farthest outward circumferentially may be 0.5, and the spacing for the middle wiring member W6 may be in the range of greater than 0.5 and less than 1, such that the spacing successively decreases toward the outer circumferential side. The higher the number of connection points W6a on the outer circumferential side of the circuit pattern 35, the more the resistance on the outer circumferential side of the circuit pattern 35 can be lowered, thereby making it possible to make the heat distribution of the circuit pattern 35 uniform and obtain an even greater effect of suppressing abnormal overheating. Also, the above embodiment describes a case where the wiring members W6 are formed on the straight part 35a of the circuit pattern 35, but the configuration is not limited thereto and may be modified appropriately in the case of the corner part 35b in FIG. 4 and the outer circumferential side in FIG. 5.

Also, although not specifically illustrated, in the wiring members W6 formed on the straight part 35a of the circuit pattern 35 in FIG. 3, the corner part 35b in FIG. 4, and the outer circumferential side in FIG. 5, the material of the plurality of wiring members W6 arranged side by side in the width direction of the circuit pattern 35 may have higher conductivity proceeding circumferentially outward. For example, the inner circumferential side may be aluminum or an aluminum alloy while the outer circumferential side may be copper or a copper alloy. Furthermore, the diameter of the plurality of wiring members W6 may also be increased proceeding circumferentially outward. For example, the plurality of wiring members W6 may be wires having a diameter of 100 μm or greater and less than 300 μm on the inner circumferential side, and having a diameter of 300 μm or greater and 500 μm or less on the outer circumferential side. In this way, it is possible to appropriately modify the configuration with which the resistance of the circuit pattern 35 is lowered proceeding circumferentially outward. In other words, by providing a relative way of lowering the resistance proceeding circumferentially outward, it is possible to suppress abnormal overheating more flexibly.

Also, the above embodiment describes a case where the circuit pattern 35 is formed having an L-shape in a plan view, but the shape of the circuit pattern 35 is not limited thereto and may be modified appropriately. For example, a circuit pattern 37 formed having a crank shape in a plan view may also be configured, as illustrated in FIGS. 7 and 8.

Specifically, the circuit pattern 37 has a first straight part 37a extending in a predetermined direction (the vertical direction on the page in FIGS. 7 and 8), and a first corner part 37b and a second corner part 37c bent in a different direction (perpendicular direction) from the extension direction of the first straight part 37a from either end of the first straight part 37a. The first corner part 37b and the second corner part 37c are bent to point in opposite directions from each other.

In FIG. 7, two wiring members W7 are disposed on the top face of the first corner part 37b. The wiring members W7 are disposed to form an L-shape in a plan view along the bend direction of the first corner part 37b. Also, two wiring members W7 are provided side by side in the width direction of the circuit pattern 37. Furthermore, the two wiring members W7 are disposed off-center toward the outer circumferential side of the first corner part 37b. Also, each wiring member W7 is provided with four connection points W7a with respect to the circuit pattern 37.

Similarly, two wiring members W7 are also disposed on the top face of the second corner part 37c. The wiring members W7 are disposed to form an L-shape in a plan view along the bend direction of the second corner part 37c. Also, two wiring members W7 are provided side by side in the width direction of the circuit pattern 37. Furthermore, the two wiring members W7 are disposed off-center toward the outer circumferential side of the second corner part 37c. Also, each wiring member W7 is provided with four connection points W7a with respect to the circuit pattern 37.

In FIG. 8, the wiring members W7 are disposed on the top face of the first straight part 37a. Specifically, in the first straight part 37a on the side near the first corner part 37b, two wiring members W7 are disposed off-center toward the outer circumferential side of the first corner part 37b and along the extension direction of the first straight part 37a. The two wiring members W7 are disposed side by side in the width direction of the first straight part 37a.

On the other hand, in the first straight part 37a on the side near the second corner part 37c, two wiring members W7 are disposed off-center toward the outer circumferential side of the second corner part 37c and along the extension direction of the first straight part 37a. The two wiring members W7 are disposed side by side in the width direction of the first straight part 37a.

As in FIGS. 7 and 8, by providing the wiring members W7 on the crank-shaped circuit pattern 37 at locations where the flow of current is expected to be difficult, current is made to flow more easily throughout the entire circuit pattern 37. Consequently, it is possible to make the heat distribution of the circuit pattern 37 uniform and prevent localized abnormal overheating.

As described above, according to the present invention, by disposing wiring members at locations on the circuit pattern where the flow of current is considered difficult, it is possible to suppress abnormal overheating of the circuit pattern while also raising the current rating.

Also, in the above embodiment, the number and placement of the insulating circuit substrates 3 and the semiconductor elements 4 are not limited to the above configuration and may be changed appropriately. Similarly, the number of disposed wiring members and the number of connection points of the wiring members with respect to the circuit pattern may also be modified appropriately.

Also, in the above embodiment, the number and layout of circuit patterns are not limited to the above configuration and may be changed appropriately.

Also, the above embodiment takes a configuration in which the insulating circuit substrates 3 and the semiconductor elements 4 are formed in a rectangular or square shape in a plan view, but the embodiment is not limited to this configuration. The insulating circuit substrates 3 and the semiconductor elements 4 may also be formed in a polygonal shape other than the above.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

A semiconductor module circuit structure according to the above embodiment is provided with: an insulating circuit substrate in which a circuit pattern is formed on a top face of an insulating plate; and a semiconductor element disposed on a top face of the circuit pattern, wherein the circuit pattern includes a straight part extending in a predetermined direction and a corner part bent in a different direction from the extension direction of the straight part, and on a top face of the straight part, a wiring member that follows the extension direction of the straight part is disposed off-center toward an outer circumferential side of the corner part.

Also, a semiconductor module circuit structure according to the above embodiment is provided with: an insulating circuit substrate in which a circuit pattern is formed on a top face of an insulating plate; and a semiconductor element disposed on a top face of the circuit pattern, wherein the circuit pattern includes a straight part extending in a predetermined direction and a corner part bent in a different direction from the extension direction of the straight part, and on a top face of the corner part, a wiring member that follows the bend direction is disposed off-center toward an outer circumferential side.

Also, in another semiconductor module circuit structure according to the above embodiment, the wiring member is also disposed on a top face of the corner so as to follow the bend direction off-center toward the outer circumferential side.

Also, in the semiconductor module circuit structure according to the above embodiment, the wiring member is connected to the circuit pattern at a plurality of points.

Also, in the semiconductor module circuit structure according to the above embodiment, the wiring member is disposed plurally side by side in a width direction of the circuit pattern.

Also, in the semiconductor module circuit structure according to the above embodiment, the number of connection points of the wiring member with respect to the circuit pattern increases proceeding circumferentially outward in the width direction the circuit pattern.

Also, in the semiconductor module circuit structure according to the above embodiment, a material of the wiring member disposed plurally side by side in the width direction of the circuit pattern has higher conductivity proceeding circumferentially outward.

Also, in the semiconductor module circuit structure according to the above embodiment, a diameter of the wiring member disposed plurally side by side in the width direction of the circuit pattern increases proceeding circumferentially outward.

Also, in the semiconductor module circuit structure according to the above embodiment, the semiconductor element is an RC-IGBT element combining functions of an IGBT element and an FWD element.

INDUSTRIAL APPLICABILITY

As described above, the present invention has an effect of suppressing abnormal overheating of the circuit pattern while also raising the current rating, and is particularly useful in the semiconductor module circuit structure.

This application is based on Japanese Patent Application No. 2019-124452 filed on Jul. 3, 2019, the content of which is hereby incorporated in entirety.

What is claimed is:

1. A semiconductor module circuit structure, comprising:
an insulating circuit substrate having
an insulating plate, and
a circuit pattern formed on a top face of the insulating plate; and
a semiconductor element disposed on a top face of the circuit pattern, wherein
the circuit pattern includes
a first straight part extending in a first direction,
a second straight part extending in a second direction different from the first direction, and
a corner part connecting the first and second straight parts; and
a wiring member is formed on a top surface of the first straight part along the first direction, the wiring member being formed off-center at the first straight part to be closer to an outer periphery of the circuit pattern.

2. The semiconductor module circuit structure according to claim 1, wherein
the wiring member is also disposed on a top face of the corner part so as to turn from the first direction to the second direction, and is off-center at the corner part to be closer to the outer periphery of the circuit pattern.

3. The semiconductor module circuit structure according to claim 1, wherein the wiring member is connected to the circuit pattern at a plurality of connection points.

4. The semiconductor module circuit structure according to claim 3, wherein the wiring member is disposed in plurality, the plurality of the wiring members being arranged substantially in parallel to one another.

5. The semiconductor module circuit structure according to claim 4, wherein between any two of the plurality of the wiring members, the one closer to the outer periphery of the circuit pattern has more connection points than the other.

6. The semiconductor module circuit structure according to claim 4, wherein between any two of the plurality of the wiring members, the one closer to the outer periphery of the circuit pattern has higher conductivity than the other.

7. The semiconductor module circuit structure according to claim 4, wherein between any two of the plurality of the wiring members, the one closer to the outer periphery of the circuit pattern has a larger diameter than the other.

8. The semiconductor module circuit structure according to claim 1, wherein the semiconductor element is a Reverse Conducting-Insulated Gate Bipolar Transistor (RC-IGBT) element combining functions of an IGBT element and a freewheeling diode (FWD) element.

9. A semiconductor module circuit structure, comprising:
an insulating circuit substrate having
an insulating plate, and
a circuit pattern formed on a top face thereof; and
a semiconductor element disposed on a top face of the circuit pattern, wherein
the circuit pattern includes
a first straight part extending in a first direction,
a second straight part extending in a second direction different from the first direction, and
a corner part connecting the first and second straight parts, and
a wiring member is formed on a top surface of the corner part, off-center at the corner part to be closer to an outer periphery of the circuit pattern, a direction in which the wiring member extends changing from the first direction to the second direction.

10. The semiconductor module circuit structure according to claim 9, wherein the wiring member is disposed in plurality, the plurality of the wiring member being arranged substantially in parallel to one another.

11. The semiconductor module circuit structure according to claim 10, wherein
each of the plurality of wiring members is connected to the circuit pattern at a plurality of connection points, and
between any two of the plurality of the wiring members, the one closer to the outer periphery of the circuit pattern has more connection points than the other.

12. The semiconductor module circuit structure according to claim 10, wherein
between any two of the plurality of the wiring members, the one closer to the outer periphery of the circuit pattern has higher conductivity than the other.

13. The semiconductor module circuit structure according to claim 10, wherein
between any two of the plurality of the wiring members, the one closer to the outer periphery of the circuit pattern has a larger diameter than the other.

* * * * *